United States Patent
Lee et al.

(10) Patent No.: US 12,268,036 B2
(45) Date of Patent: Apr. 1, 2025

(54) SOLAR CELL MODULE FOR CULTIVATION FACILITIES

(71) Applicants: KOREA INSTITUTE OF SCIENCE AND TECHNOLOGY, Seoul (KR); Kookmin University Industry Academy Cooperation Foundation, Seoul (KR)

(72) Inventors: Phillip Lee, Seoul (KR); Byoung Koun Min, Seoul (KR); Je Hyeong Jung, Gangneung-si (KR); Young Rag Do, Seoul (KR); Chan Woo Lee, Seoul (KR)

(73) Assignees: Korea Institute of Science and Technology, Seoul (KR); Kookmin University Industry Academy Cooperation Foundation, Seoul (KR)

( * ) Notice: Subject to any disclaimer, the term of this patent is extended or adjusted under 35 U.S.C. 154(b) by 0 days.

(21) Appl. No.: 18/089,314

(22) Filed: Dec. 27, 2022

(65) Prior Publication Data
US 2023/0335661 A1    Oct. 19, 2023

(30) Foreign Application Priority Data
Apr. 13, 2022   (KR) ................ 10-2022-0045561

(51) Int. Cl.
*H10F 77/42*    (2025.01)
*H02S 40/22*    (2014.01)

(52) U.S. Cl.
CPC ........... *H10F 77/492* (2025.01); *H02S 40/22* (2014.12); *H10F 77/488* (2025.01)

(58) Field of Classification Search
CPC . H01L 31/0547; H01L 31/0549; H02S 40/22; H10F 77/488; H10F 77/492
See application file for complete search history.

(56) References Cited

U.S. PATENT DOCUMENTS

| | | | |
|---|---|---|---|
| 2013/0000691 A1* | 1/2013 | Aharon | H01L 31/0547 136/246 |
| 2021/0265943 A1* | 8/2021 | Severgnini | H02S 20/32 |

FOREIGN PATENT DOCUMENTS

| | | |
|---|---|---|
| JP | 2002-281830 A | 10/2002 |
| JP | 4388664 B2 | 12/2009 |
| JP | 5829708 B2 | 12/2015 |
| KR | 10-2218317 B1 | 2/2021 |
| KR | 10-2237493 B1 | 4/2021 |
| WO | WO-2015158968 A1 * 10/2015 ............. A01G 9/243 |

OTHER PUBLICATIONS

English machine translation of WO2015158968A1 (Year: 2015).*

* cited by examiner

*Primary Examiner* — Lindsey A Buck
(74) *Attorney, Agent, or Firm* — NSIP Law

(57) ABSTRACT

According to a main objective of the present invention, the three-dimensional arrangement of solar cells is adjusted so as to use sunlight directly coming from the sun mainly for solar power generation while transmitting wavelengths necessary for the growth of plants and reflecting wavelengths unnecessary for or hindering the growth of plants among wavelengths of sunlight passing through the solar cells to use the reflected wavelengths for additional solar power generation.

Sunlight reflected by the dichroic optical filter may be used to additionally generate electricity using solar cells provided perpendicular to the dichroic optical filter, thereby maximizing the use efficiency of sunlight.

1 Claim, 5 Drawing Sheets

[Fig. 1]
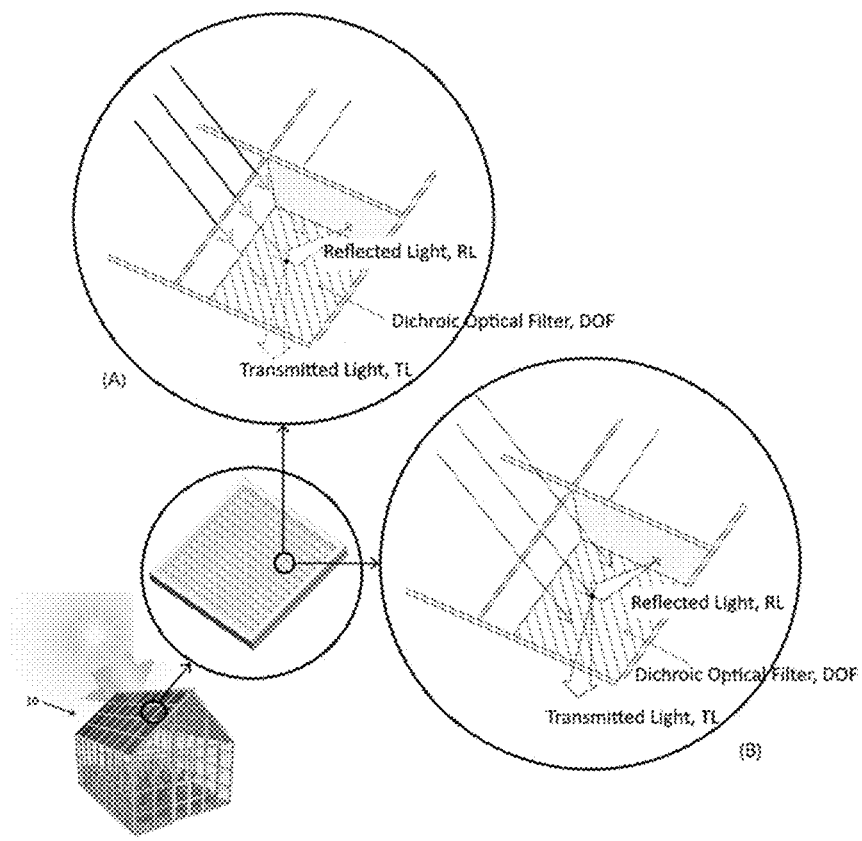
[Fig. 2]
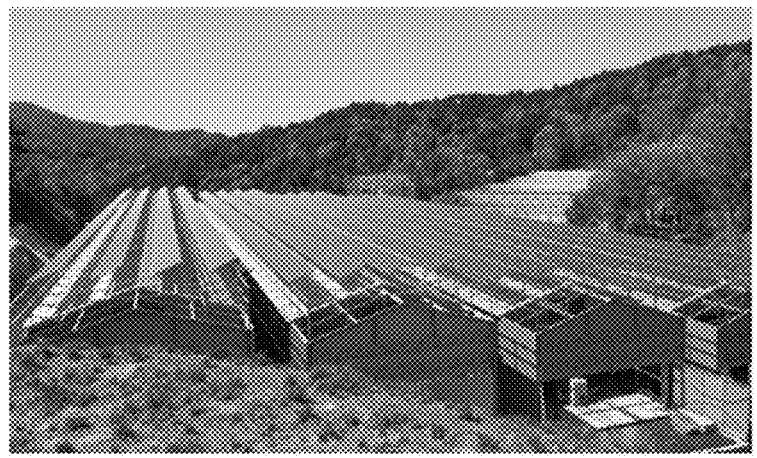
LIGHT TRANSMISSION IS SECURED BY REDUCING THE LIGHT-RECEIVING AREA OF SOLAR CELLS (TRADE-OFF RELATIONSHIP BETWEEN LIGHT TRANSMISSION AND EFFICIENCY)
--Prior Art--

[Fig. 3]
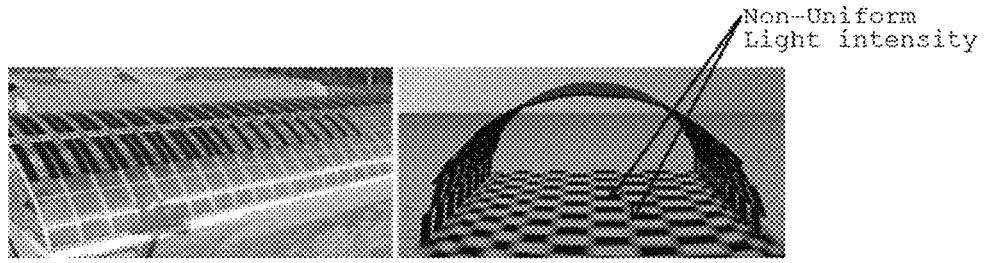
DISCONTINUOUS TRANSMISSION OF LIGHT IS INEVITABLE DUE TO SOLAR CELLS, AND THUS THE DEVELOPMENT OF NEW SOLAR CELL MODULES IS NEEDED
--Prior Art--
[Fig. 4]
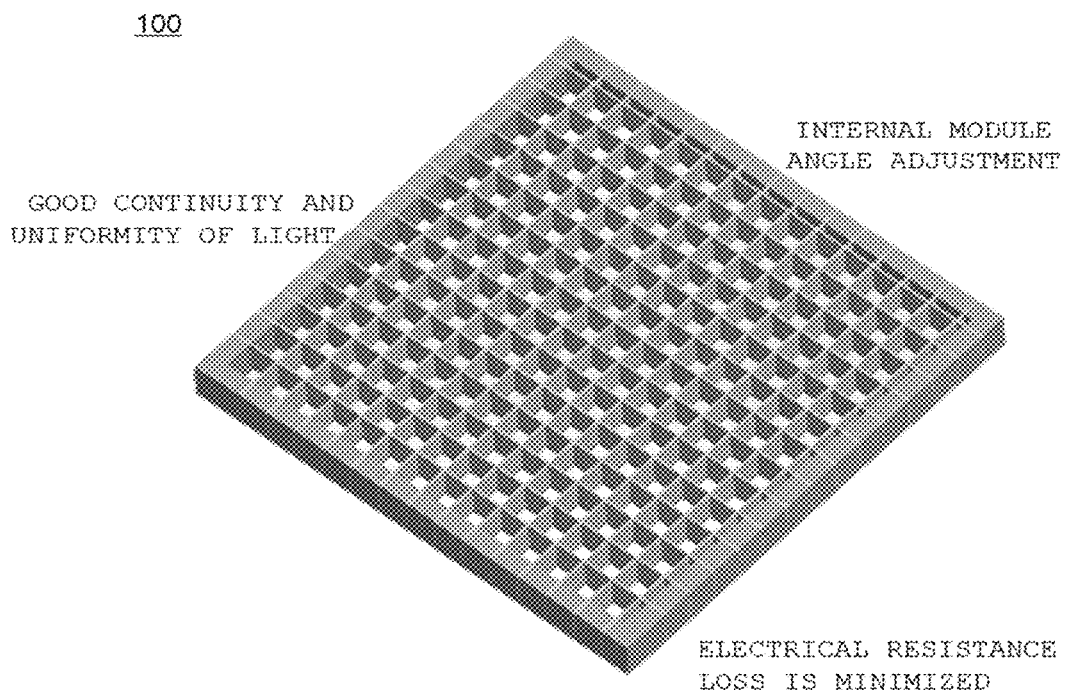
[Fig. 5]
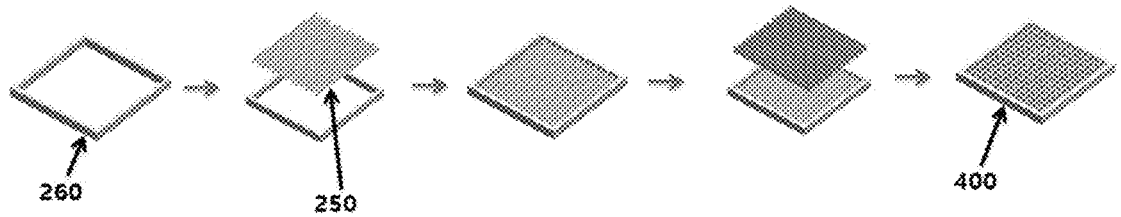

[Fig.6]
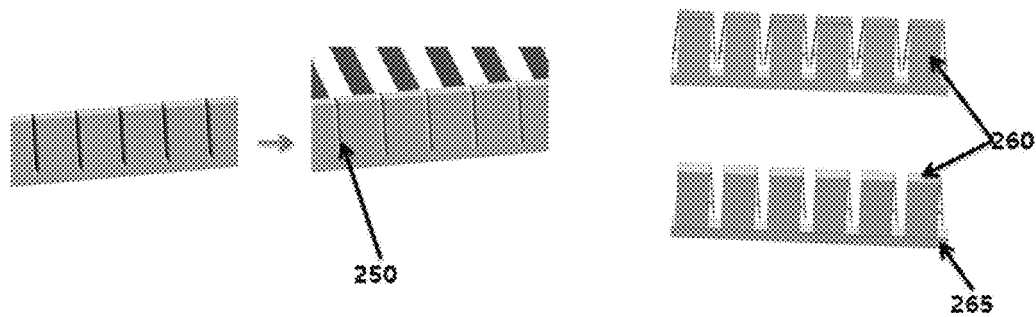
[Fig.7]
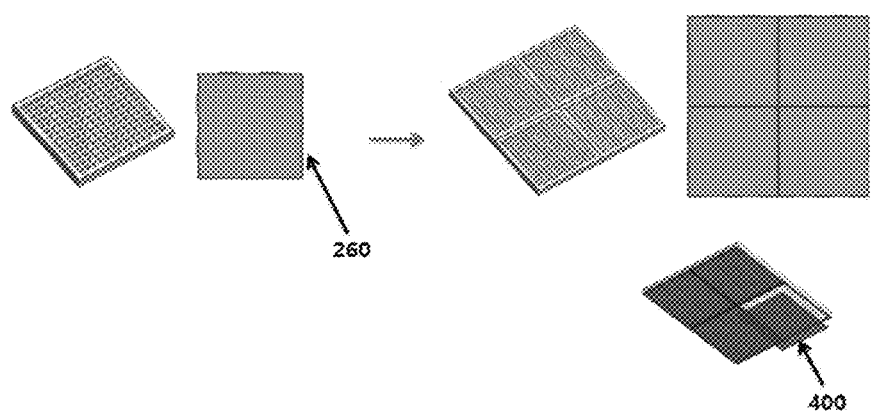
[Fig.8]
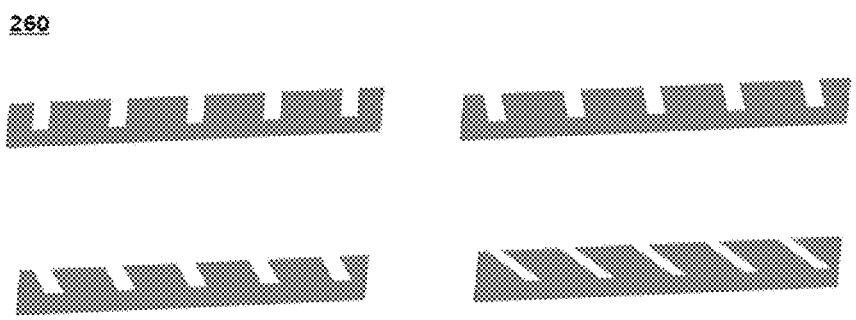

[Fig. 9]
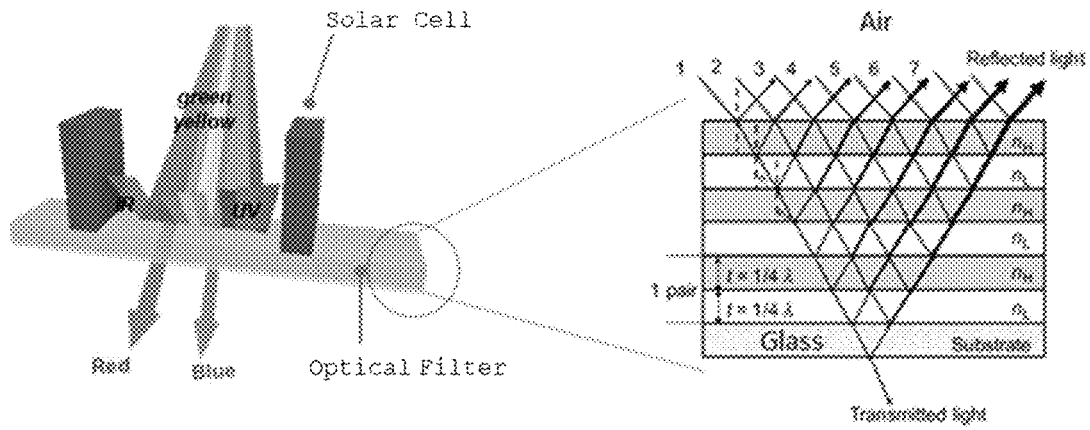
[Fig. 10]
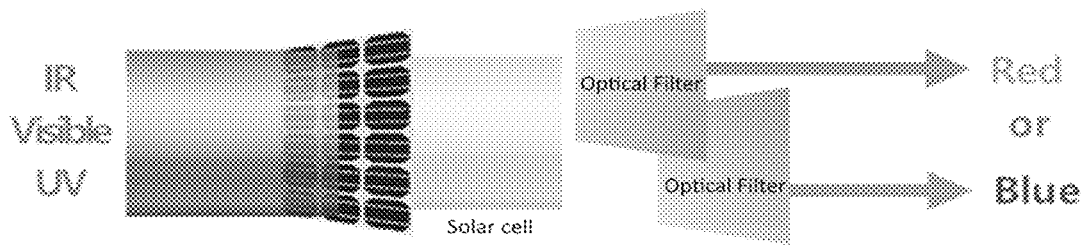
--Prior Art--
[Fig. 11]
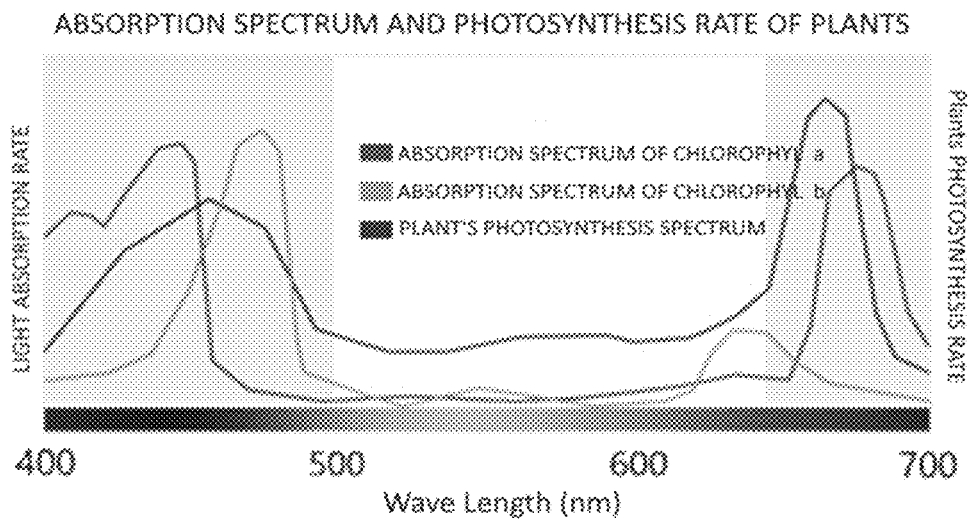

[Fig.12]

SOLAR CELL MODULE FOR CULTIVATION FACILITIES

CROSS-REFERENCE TO RELATED APPLICATION(S)

This application claims benefit of priority to Korean Patent Application No. 10-2022-0045561 filed on Apr. 13, 2022 in the Korean Intellectual Property Office, the disclosure of which is incorporated herein by reference in its entirety.

BACKGROUND

1. Field

The present invention relates to solar cells for solar power generation, and more particularly, to solar cells for cultivation facilities, greenhouses, and smart farms, and solar power generation and cultivation techniques in which sunlight necessary for plant growth is selectively transmitted, and reflected sunlight not used for plant cultivation is used for solar power generation.

2. Description of Related Art

As a prior art before the application of the present invention, a solar energy conversion technique is disclosed in a Japanese Patent Publication. Reflected and collected sunlight is concentrated on adjacent solar cells to generate electricity, and heat is collected through cooling water pipes provided on the back sides of the solar cells. According to this technique, one device is used for both the generation of electricity and the use of solar heat.

Another prior art discloses a vertical solar power generation device. The vertical solar power generation device includes: a main framework frame extending upright on an upper part of a building and including a transparent ceiling member installed on a lengthwise upper side thereof; a plurality of solar cell panel units installed at regular intervals from a lower side to an upper side inside the main framework frame, each of the solar cell panel units including a plurality of solar cells provided on an upper surface inclined at a certain angle toward the sky for collecting sunlight; and angle adjustment units rotatably connected to the main framework frame and capable of adjusting the angles of the solar cell panel part units, wherein the main framework frame includes: a plurality of upright frames installed upright on the roof of the building; a connection frame connecting the lengthwise upper ends of the upright frames to each other; and installation frames installed at regular intervals along the longitudinal direction of the upright frames to connect the upright frames to each other, wherein a transparent ceiling member formed of a transparent material is installed on the connection frame to prevent rainwater from falling to the lower side of the main framework frame in case of rain, a transparent body is installed on the main framework frame to protect the solar cell panel units from rain and snow, and the solar cell panel units are rotatable by the angle adjustment units installed on the main framework frame, wherein the each of angle adjustment units includes: a connection support pole having both lengthwise sides connected to an installation frame; a panel member having an arc shape in which a lengthwise side is connected to a solar cell panel unit, the other lengthwise side extends toward the connection support pole, and a screw thread is formed on a surface along the length of the arc shape; an installation body installed on the connection support pole such that the panel member may pass through the installation body; a driving gear mechanism engaged with the screw thread of the panel member at the installation body; and a drive motor installed on a seating plate provided on the connection support pole and having a driving shaft connected to the driving gear mechanism.

Another prior art discloses a dye-sensitized solar cell. The dye-sensitized solar cell includes: a first transparent electrode; a second transparent electrode facing the first transparent electrode; a photoactive layer provided between the first transparent electrode and the second transparent electrode, the photoactive layer including an electrolyte containing a photosensitive dye; a first wavelength conversion layer provided on the first transparent electrode and including a first wavelength conversion material for converting light in a wavelength region selected from ultraviolet to purple wavelength regions into light in a relatively long wavelength region; and a second wavelength conversion layer provided on the second transparent electrode and including a second wavelength conversion material for converting light in a wavelength region selected from infrared to red wavelength regions into light in a relatively short wavelength region, wherein the first wavelength conversion layer, the first transparent electrode, the photoactive layer, the second transparent electrode, and the second wavelength conversion layer are sequentially provided; the content of the first wavelength conversion material in the first wavelength conversion layer is from 0.9 M to 1.0 M; the second wavelength conversion material includes a fluorescence pair formed of a receptor and a sensitizer; the content of the sensitizer in the second wavelength conversion layer is from 6 mM to 12 mM; the molar ratio of the sensitizer and the receptor ranges from 1:500 to 1:1000; among the first wavelength conversion layer and the second wavelength conversion layer, at least the second wavelength conversion layer includes light scattering particles; the content of the light scattering particles in the second wavelength conversion layer is from 0.04 wt % to 0.06 wt %; and the average light transmittance of the second wavelength conversion layer ranges from 50% to 80% at a wavelength of 400 nm to 800 nm, and ranges from 30% to 60% at a wavelength of 400 nm to 800 nm.

Another prior art discloses a light source for plant cultivation, a plant cultivation method, and a plant cultivation container. This prior art involves a cultivation device including: a shelf unit 1 for placing a plant thereon; and a light source support unit 3 on which a light source 2, that is, a white diode formed of an InGaN-based semiconductor material, is installed for the plant placed on the shelf, wherein a permanent magnet 6 is provided on the shelf unit 1. In the cultivation device, the white diode emits light containing a blue light component (having a wavelength of 430 nm to 470 nm) and a red light component (having a wavelength of 630 nm to 680 nm) which are necessary for plant growth.

Another prior art discloses a plant lighting device. The plant lighting device includes: a cultivation lighting unit for wavelengths necessary for plant cultivation, the cultivation lighting unit having a short-wavelength lighting unit configured to emit light in a light wavelength range of 350 nm to 450 nm, a red lighting unit configured to emit light in a light wavelength range of 600 nm to 700 nm, and a far-red lighting unit configured to emit light in a light wavelength range of 700 nm to 800 nm; a vision lighting unit configured to emit light in a light wavelength range of 450 nm to 600 nm; and a lighting circuit unit for turning on or off the cultivation lighting unit and the vision lighting unit.

PRIOR ART DOCUMENTS

Patent Documents (Patent Document 1) Japanese Patent Registration No. JP5829708

(Patent Document 2) Korean Patent Registration No. 10-2237493

(Patent Document 3) Korean Patent Registration No. 10-2218317

(Patent Document 4) Japanese Patent Application Laid-Open No. 2002-281830

(Patent Document 5) Japanese Patent Registration No. 4388664

SUMMARY

The present invention relates to a solar cell module for a smart-farm greenhouse. Both the solar energy and electricity are necessary for cultivating plants in facilities, greenhouses, or smart farms. In particular, it is very important to produce electricity necessary for smart farms from renewable energy such as sunlight in the coming carbon-neutral era. Therefore, sunlight is needed to produce electricity and grow crops in smart farms. In addition, some smart-farm crops need a relatively large amount of sunlight for photosynthesis, and other smart-farm crops need a relatively small amount of sunlight for photosynthesis.

In addition, not all the wavelengths of sunlight are used for growing crops. That is, some wavelengths are essential for the growth of crops while other wavelengths such as wavelengths introducing pests are unnecessary or non-essential for the growth of crops. Light in the infrared wavelength band produces heat and increases in summer, thereby having a negative effect on crops in facilities and hindering the growth of crops in facilities. Therefore, if only wavelengths necessary for plant cultivation are introduced into a cultivation facility, plants may grow in a more effective environment, and workers may be less tired.

In addition, although a crop is densely planted in a smart farm, sunlight entering the smart farm in an amount greater than necessary for the growth of the crop is a waste of energy. Therefore, it will be useful to use a surplus amount of sunlight for generating electricity depending on the types of crops.

Therefore, sunlight may be most effectively used by transmitting wavelengths necessary for cultivation depending on the types of plants and the density of planting, and reflecting wavelengths, which are unnecessary for the growth of plants or hinder the growth of plants, to use the reflected wavelengths for generating power using solar cells.

In the related art, however, when a solar power panel is installed on one side of a cultivation facility, greenhouse, or smart farm, the amount of light transmission varies depending on positions (refer to FIGS. 2 and 3). When transparent solar cells are used, the overall wavelength band of light reduces, and thus red and blue light necessary for cultivating plants may be insufficient. That is, light having wavelengths essential for the growth of plants may reach plants in a small amount, and thus there may be a negative effect on the growth of plants.

To solve the problems described above, the present invention provides the following solutions.

According to embodiments, smart-farm solar cells include: a solar cell adjusting transmission of sunlight coming from the sun by using a three-dimensional structure; a dichroic optical filter transmitting selected wavelengths of sunlight passing through the solar cell and reflecting other wavelengths of the sunlight; and a semi-transparent or transparent solar cell generating electricity by using sunlight directly coming from the sun, wherein not all wavelengths of sunlight reflected by the dichroic optical filter propagate to air but some of the wavelengths propagate to the solar cell and are reflected by the solar cell to the semi-transparent or transparent solar cell such that the semi-transparent or transparent solar cell additionally generates electricity using the wavelengths reflected thereto.

In addition, the selected wavelengths, which the dichroic optical filter transmits, may include a blue wavelength ranging from 400 nm to 500 nm and/or a red wavelength ranging from 640 nm to 700 nm which are necessary for plant cultivation, and the dichroic optical filter reflects other wavelengths.

In addition, the dichroic optical filter may transmit light in a wavelength band necessary for plant cultivation and may reflect remaining visible light and all or a portion of infrared light in a wavelength band of 850 nm to 1300 nm.

In addition, the smart-farm solar cells may have an adjustable three-dimensional structure in which a plurality of solar cells are provided at a light entrance side of the dichroic optical filter in parallel to a direction in which sunlight is incident on the light entrance side of the dichroic optical filter, the solar cells having a set height in a direction perpendicular to the dichroic optical filter, a set width, and a set interval therebetween and being arranged in horizontal and/or vertical directions.

In addition, when a sun plant is cultivated, sunlight passing through the solar cells provided horizontally and/or vertically with the set height, the set width, and the set interval may be increased without markedly decreasing sunlight incident on the solar cells by decreasing the set height and/or increasing the set interval.

In addition, when a shade plant is cultivated, sunlight passing through the solar cells provided horizontally and/or vertically with the set height, the set width, and the set interval may be decreased while increasing sunlight incident on the solar cells by increasing the set height and/or decreasing the set interval.

In addition, the smart-farm solar cells may be provided as modular smart-farm solar cell module having an adjustable three-dimensional structure, and the smart-farm solar cells may include a module case provided with stick-shaped or prism-shaped electrodes for fixing the dichroic optical filter having a quadrangular or polygonal shape from an outside of the dichroic optical filter, wherein the smart-farm solar cells may be assembled by inserting the smart-farm solar cells into recesses provided in the module case.

In addition, the recesses provided in the module case may be vertical, inclined, gradually inclined, or gradually vertical recesses.

In addition, the module case may include electrodes for electrical connection with an adjacent module case such that electricity generated by the smart-farm solar cells may be supplied to an electric storage device through the electrodes.

In addition, the smart-farm solar cells may have an adjustable three-dimensional structure in which a power generation unit or power generation units are provided on a single side or both sides of the solar cell in a direction perpendicular to a direction in which sunlight is incident on the solar cell so as to generate electricity mainly using sunlight directly incident from the sun and additionally generate electricity using sunlight reflected from the dichroic optical filter.

In addition, the smart-farm solar cells may have an adjustable three-dimensional structure in which solar cells are horizontal and/or vertically provided at an oblique angle in the vicinity of a light entrance side of the dichroic optical filter with various heights, widths, and intervals therebetween so as to additionally generate electricity by using wavelengths of sunlight reflected from the dichroic optical filter.

In addition, when a sun plant is cultivated, sunlight passing through the solar cells horizontally and/or vertically provided at the oblique angle with various heights, widths, and intervals may be increased without markedly decreasing sunlight incident on the solar cells by adjusting the oblique angle to be close to a right angle, decreasing the various heights, and/or increasing the various intervals.

In addition, when a shade plant is cultivated, sunlight passing through the solar cells horizontally and/or vertically provided at the oblique angle with various heights, widths, and intervals may be decreased while increasing sunlight incident on the solar cells by adjusting the oblique angle to be within a range of 0 degrees to 90 degrees according to a sunlight amount necessary for the shade plant, increasing the various heights, and/or decreasing the various intervals.

In addition, the smart-farm solar cells may be provided as modular smart-farm solar cells having an adjustable three-dimensional structure in which the solar cells are assembled by inserting the solar cells into recesses provided in a module case, the module case including stick-shaped or prism-shaped electrodes for fixing the dichroic optical filter having a quadrangular or polygonal shape.

In addition, the module case may include electrodes for electrical connection with an adjacent module case such that electricity generated by the solar cells may be supplied to an electric storage device through the electrodes.

According to other embodiments, smart-farm solar cells include: a solar cell adjusting transmission of sunlight coming from the sun by using a three-dimensional structure; and a semi-transparent or transparent solar cell generating electricity by using sunlight directly coming from the sun and capable of adjusting the amount of sunlight passing through the semi-transparent or transparent solar cell to be equal to or greater than an amount necessary for plant growth.

According to other embodiments, smart-farm solar cells include: a dichroic optical filter transmitting selected wavelengths of sunlight coming from the sun and reflecting other wavelengths of the sunlight; and a plurality of solar cells provided at a light entrance side of the dichroic optical filter at a set angle with respect to a direction in which sunlight is incident, the solar cells having an angle (90—the set angle) with respect to the dichroic optical filter, a set height, a set width, and a set interval therebetween and being arranged in horizontal and/or vertical directions. Therefore, the solar cells may adjust solar power generation and sunlight transmission and may generate electricity by using sunlight coming from the sun and wavelengths of sunlight reflected from the dichroic optical filter.

In addition, the selected wavelengths, which the dichroic optical filter transmits, may include a blue wavelength ranging from 400 nm to 500 nm and a red wavelength ranging from 640 nm to 700 nm which are necessary for plant cultivation.

In addition, when a sun plant is cultivated, transmission of sunlight to the dichroic optical filter may be increased by decreasing the set height of the solar cells, increasing the set interval between the solar cells, and/or adjusting the set angle of the solar cells such that the solar cells are almost parallel to sunlight.

In addition, when a shade plant is cultivated, transmission of sunlight to the dichroic optical filter may be decreased by increasing the set height of the solar cells, decreasing the set interval between the solar cells, and/or adjusting the set angle of the solar cells to be close to 90 degrees with respect to the direction in which sunlight is incident.

BRIEF DESCRIPTION OF DRAWINGS

FIG. 1 is a view illustrating solar cells of the present invention and a smart farm to which the solar cells are applied.

FIG. 2 is view illustrating solar cells installed according to the related art.

FIG. 3 is a view illustrating previous semi transmitted light type solar cells installed on a dome-type greenhouse of the related art.

FIG. 4 is a perspective view illustrating a solar cell module for cultivation according to the present invention.

FIG. 5 is a view illustrating how a solar cell module for a smart farm is manufactured according to the present invention.

FIG. 6 is a conceptual view illustrating electrodes used to connect solar cells according to the present invention.

FIG. 7 is a conceptual view illustrating how an extended module is manufactured by combining solar cell modules with each other according to the present invention.

FIG. 8 is a view illustrating various shapes of a module case used to connect solar cells according to the present invention.

FIG. 9 is a view illustrating characteristics of the solar cells of the present invention.

FIG. 10 is a view illustrating how transparent solar cells of the related art use light.

FIG. 11 is a view illustrating the light absorption spectrum and photosynthetic rate of plants with respect to wavelengths.

FIG. 12 is an image illustrating a cultivation model in which a glass plate on the right side is provided with a solar cell panel having a dichroic optical filter according to the present invention, and a glass plate on the left side is not provided with a dichroic optical filter.

DETAILED DESCRIPTION

Operations and effects of the present invention will now be described with reference to the accompanying drawings.

FIG. 1 is a view illustrating the operational principle of smart-farm solar cells of the present invention and a smart farm to which the solar cells are applied. The smart farm to which the solar cells of the present invention are applied is shown on the left side in FIG. 1. The solar cells of the present invention, and how the solar cells are operated for the smart farm are shown on the right side in FIG. 1. The solar cells for a smart farm (smart-farm solar cells) are operable in two manners according to the present invention. As shown on the upper side in FIG. 1, electricity may be generated by using sunlight directly reaching the smart-farm solar cells (refer to section (A)). In this case, the sunlight use rate of the smart-farm solar cells may be adjusted by adjusting the installation angle and the material of the solar cells. Section (A) in FIG. 1 shows the case of using transparent or semi-transparent solar cells on which sunlight is directly incident. Some of the sunlight passes through the solar cells and reaches a dichroic optical filter, and then the dichroic optical filter transmits wavelengths necessary for cultivation and reflects the other wavelengths back to the solar cells for generating electricity using the reflected wavelengths.

Section (B) in FIG. 1 shows the case in which sunlight is directly incident on the dichroic optical filter. In this case, the dichroic optical filter transmits wavelengths necessary for cultivation to the inside of the smart farm, and reflects other wavelengths to the solar cells provided around the dichroic optical filter such that the solar cells may generate electricity with the reflected wavelengths. Therefore, the present invention provides a method of directly using sunlight for solar power generation and a method of additionally using sunlight reflected by the dichroic optical filter for solar power generation. As a result, the efficiency of solar power generation may be maximized, and a pleasant cultivation environment may be created by reflecting wavelengths of sunlight unnecessary for cultivation to the outside of the smart farm.

The smart-farm solar cells of the present invention may be provided as a lattice-type solar cell array in which transparent, semi-transparent, or opaque, and rigid or flexible solar cells are disposed in a direction parallel or oblique to the direction of sunlight, or are disposed with various angles, various heights, and various widths at regular or irregular intervals in vertical and/or horizontal directions. Thus, the lattice-type solar cell array may allow light to uniformly reach crops without forming shadows in a cultivation facility such as the smart farm, and may vary the amount of light reaching the inside of a cultivation facility such as the smart farm. The solar cells may have a height within the range of several tens of micrometers to several tens of millimeters and may have desired lengths and widths.

Another feature of the present invention is the transmission or use of light necessary for plant cultivation. Some wavelengths of sunlight may attract pests, and ultraviolet sunlight, which releases heat, may inhibit the growth of crops in hot summer. Therefore, another objective of the present invention is to optimize the internal environment of the smart farm by: selectively transmitting various wavelengths of light for using the wavelengths for cultivation depending on the types of crops and the latitude at which crops are grown; and reflecting wavelengths of light that are unnecessary for cultivation. In addition, light passing through the dichroic optical filter and used for cultivation may include red and blue light, and thus the inside of the smart farm may appear purple or pink when viewed from the outside. In addition, the dichroic optical filter may be used for purposes other than cultivation, and in this case, two or more wavelength bands may be selected to illuminate an indoor space with various colors. FIG. 7 illustrates an example in which the dichroic optical filter is used for cultivation and thus appears purple.

Another feature of the present invention is a method of generating electricity using the smart-farm solar cells. In the related art, solar cells are arranged in a direction perpendicular to the direction of sunlight so as to use direct sunlight. This guarantees a high power generation efficiency, but does not allow the use of sunlight for other purposes such as those shown in FIGS. 2 and 3. That is, sunlight cannot pass through solar cells, or although sunlight passes through solar cells as shown in FIG. 10, the amount of sunlight is insufficient for cultivation. In the present invention, however, light necessary for cultivation passes through the dichroic optical filter, and light incident on the solar cells is used for generating electricity. A major objective of the present invention is to adjust the ratio of sunlight used for power generation and sunlight used for cultivation by adjusting the installation angle of a solar cell panel, and thus when there is a sufficient electricity source, a large portion of sunlight may be used for growing crops while using the remining portion of the sunlight for solar power generation. A feature of the present invention is to install the solar cells in parallel to or at a preset or variable angle to the direction of sunlight according to the purpose of using sunlight for cultivation. Therefore, another feature of the present invention is to generate electricity by using only reflected sunlight without using direct sunlight. To this end, single-sided solar cells, or double-sided or transparent solar cells capable of generating electricity on both sides thereof may be provided in a lattice form, and the dichroic optical filter may be further provided at lower sides of the solar cells.

The dichroic optical filter may be provided by stacking thin oxide films having different refractive indexes to induce light interference and may thus be capable of selectively transmitting some wavelengths of incident light and reflecting the other wavelengths of the incident light. The dichroic optical filter is manufactured using the wavelength-selective transmittance described above to select and use various combinations of wavelengths according to the types of crops, the time of cultivation, the location of cultivation (latitude and longitude), and the like.

FIG. 2 is view illustrating solar cells installed according to the related art. Solar cell panels are installed in an east-south-west direction according to the movement of the sun so as to effectively use sunlight, and no solar cell panels are installed on the opposite side. Little sunlight passes through the solar cell panels, and thus it is impossible to grow crops in regions in which the solar cell panels are installed.

FIG. 3 is a view illustrating previous semi transmitted light type installed on a dome-type greenhouse of the related art. Opaque or semi-transparent solar cells may be installed on the surface of a greenhouse. When solar power generation is performed in this state, the amount of sunlight reaching the inside of the greenhouse markedly reduces, and thus plants may grow slow or hardly. That is, power generation may be useless, and plants may not grow.

FIG. 4 is a perspective view illustrating a solar cell module for a smart farm according to the present invention. The present invention provides solar cells suitable for cultivation in a smart farm by combining the solar cells with a dichroic optical filter in a vertical arrangement structure, thereby enabling solar power generation while solving the problem of an insufficient amount of sunlight when transparent solar cells of the related art are used for cultivation. In the present invention, the amount of light transmitted for cultivation can be adjusted by adjusting the installation angle of lattice-type solar cells.

FIG. 5 is a view illustrating steps of manufacturing a solar cell module for a smart farm according to the present invention. A solar cell module may be manufactured through a step of manufacturing solar cells; a step of cutting the solar cells to required sizes such that the solar cells may be combined in a lattice form; a step of preparing a module case provided with electrodes for assembling the solar cells; and a step of coupling the solar cells to the module case.

In addition, a laminate film, which is provided with a dichroic optical filter for realizing a method of using sunlight according to the present invention, is attached to a lower side of the combined solar cells, and a cover is attached to an upper side of the combined solar cells to protect the solar cell module. The cover is for simple protection from external dust and rainwater. The laminate film basically includes a transparent encapsulation film, the dichroic optical filter, and a transparent flexible substrate. If necessary, the laminate film may further include an infrared reflective film, an ultraviolet reflective film, or the like. The laminate film may induce diffused reflection, and thus light passing through the solar cell module may uniformly reach crops.

FIG. 6 is a views illustrating electrodes used to connect smart-farm solar cells according to the present invention. FIG. 6 shows how electrodes of a module case are connected to solar cells which are cut. The electrodes are formed in a narrow plate shape, and ends of the electrodes to be connected to the solar cells are rolled up to improve the coupling strength between the electrodes and the solar cells.

FIG. 7 is a conceptual view illustrating how an extended module is manufactured by combining solar cell modules with each other according to the present invention. Referring to the conceptual view, solar cell modules are connected to each other in vertical and horizontal directions, and electrodes are connected to each other. The connections may be made using convex and concave structures formed on the surfaces of cases, or may be made using an adhesive, bolts and nuts, or magnets. When the connections are made using magnets, the directions of electrode connections may be naturally determined by the directions of magnetic forces.

FIG. 8 is a view illustrating various shapes of a module case used to connect solar cells in a lattice form according to the present invention. The module case may have a shape for fixing solar cells in a vertical direction or at an oblique angle. However, solar cells may be assembled and fixed at an angle other than the angles shown in FIG. 8.

FIG. 9 is a view illustrating characteristics of smart-farm solar cells according to the present invention. According to the present invention, when sun plants are cultivated, the number of solar cells is reduced, and the height of the solar cells are reduced. Then, a large amount of light enters a smart farm, and light reflected by a dichroic optical filter is used to generate electricity using the solar cells. When shade plants are cultivated, a large amount of light is not necessary for cultivating the shade plants, and thus the amount of light reaching solar cells may be increased by densely installing the solar cells and increasing the height of the solar cells. In this case, the amount of sunlight transmission may be reduced, and a larger amount of sunlight may be used for power generation.

FIG. 10 is a view illustrating how transparent solar cells of the related art use light. Transparent solar cells of the related art reduce the amount of light at all wavelengths when the light passes through the transparent solar cells, and thus the amount of light usable for plant cultivation may markedly reduce. Therefore, the transparent solar cells of the related art may not be used for plant cultivation. In addition, the transparent solar cells of the related art may transmit only one wavelength and may thus be not suitable for plant cultivation.

FIG. 11 is a view illustrating the light absorption spectrum and photosynthesis rate of plants with respect to wavelengths. Wavelengths essential for plant cultivation is shown in FIG. 11, and the use of wavelengths essential for plant cultivation is a core principle of the present invention. According to a feature of the present invention, wavelengths necessary for plant cultivation are supplied to plants, and other wavelengths are reflected to use the other wavelengths for solar power generation. Therefore, broadband solar cells capable of generating electricity using sunlight in all wavelength bands from the infrared wavelength band to the ultraviolet wavelength band may be preferably used.

FIG. 12 shows an embodiment in which solar cells of the present invention are fixed to a glass plate. The solar cells are provided only in a horizontal direction, and although the solar cells are fixed to the glass plate, it is clearly shown that the glass plate transmits sunlight. The most prominent feature of the present invention is that solar cells arranged in vertical and/or horizontal directions transmit sunlight without forming shades so that the sunlight may be used for plant cultivation.

In the present invention, the wavelength of light to be transmitted for cultivation of plants ranges from 400 nm to 500 and from 640 nm to 700 nm. However, in areas near the equator or in summer, it is needed to maintain the inside of a smart farm at a low temperature by reflecting sunlight in a wide wavelength band. Therefore, in areas where heat is a concern, it is useful for plant growth to transmit and release sunlight mainly in a wavelength band of 400 nm to 500 nm. In addition, insufficient wavelengths necessary for plant growth may be additionally supplied using a separate red LED light.

As the distance from the equator increases, it is important to increase the inside temperature of a smart farm. Thus, light in a wavelength band of 640 nm to 700 nm and infrared rays may be mainly transmitted to the inside of a smart farm so as to increase the inside temperature of the smart farm, and light in other wavelength bands may be slightly transmitted to the inside of the smart farm to maintain the inside temperature of the smart farm.

The present invention provides smart-farm solar cells arranged in a lattice form to allow wavelengths of sunlight necessary for plant growth to be used for growing plants, and to use sunlight without affecting plant growth. Electricity generated using the smart-farm solar cells may be used for cooling or heating a smart farm or may be used in other control units.

For the effects described above, the present invention has the following configurations.

According to embodiments, smart-farm solar cells include: a dichroic optical filter transmitting selected wavelengths of sunlight coming from the sun and reflecting other wavelengths of the sunlight; and a plurality of solar cells provided at a light entrance side of the dichroic optical filter in parallel to the direction in which sunlight is incident, the solar cells having a set height in a direction perpendicular to the dichroic optical filter, a set width, and a set interval therebetween and being arranged in horizontal and/or vertical directions so as to generate electricity by using sunlight reflected from the dichroic optical filter.

In addition, the selected wavelengths, which the dichroic optical filter transmits, may include a blue wavelength ranging from 400 nm to 500 nm and a red wavelength ranging from 640 nm to 700 nm which are necessary for plant cultivation.

In addition, when a sun plant is cultivated, sunlight passing through the solar cells provided horizontally and/or vertically with the set height, the set width, and the set interval is increased by decreasing the set height and/or increasing the set interval.

In addition, when a shade plant is cultivated, sunlight passing through the solar cells provided horizontally and/or vertically with the set height, the set width, and the set interval is decreased by increasing the set height and/or decreasing the set interval.

In addition, the smart-farm solar cells include a module case provided with stick-shaped or prism-shaped electrodes for fixing the dichroic optical filter having a quadrangular or polygonal shape from an outside of the dichroic optical filter, wherein the smart-farm solar cells are assembled by inserting the smart-farm solar cells into recesses provided in the module case.

In addition, the recesses provided in the module case are vertical, inclined, gradually inclined, or gradually vertical recesses.

In addition, the module case includes electrodes for electrical connection with an adjacent module case such that electricity generated by the smart-farm solar cells may be supplied to an electric storage device through the electrodes.

In addition, a power generation unit or power generation units are provided on a single side or both sides of each of the solar cells in a direction perpendicular to a direction in which sunlight is incident on the solar cell so as to generate electricity using sunlight reflected from the dichroic optical filter.

According to other embodiments, smart-farm solar cells include: a dichroic optical filter transmitting selected wavelengths of sunlight coming from the sun and reflecting other wavelengths of the sunlight; and solar cells horizontal and/or vertically provided at an oblique angle in the vicinity of a light entrance side of the dichroic optical filter with various heights, widths, and intervals therebetween so as to generate electricity by using wavelengths of sunlight reflected from the dichroic optical filter.

In addition, the selected wavelengths, which the dichroic optical filter transmits, may include a blue wavelength ranging from 400 nm to 500 nm and a red wavelength ranging from 640 nm to 700 nm which are necessary for plant cultivation.

In addition, when a sun plant is cultivated, sunlight passing through the solar cells horizontally and/or vertically provided at the oblique angle with various heights, widths, and intervals may be increased by adjusting the oblique angle to be close to a right angle, decreasing the various heights, and/or increasing the various intervals.

In addition, when a shade plant is cultivated, sunlight passing through the solar cells horizontally and/or vertically provided at the oblique angle with various heights, widths, and intervals may be decreased by adjusting the oblique angle to be within a range of 0 degrees to 90 degrees according to a sunlight amount necessary for the shade plant, increasing the various heights, and/or decreasing the various intervals.

In addition, the solar cells may be assembled by inserting the solar cells into recesses provided in a module case, the module case including stick-shaped or prism-shaped electrodes for fixing the dichroic optical filter having a quadrangular or polygonal shape.

In addition, the module case may include electrodes for electrical connection with an adjacent module case such that electricity generated by the solar cells is supplied to an electric storage device through the electrodes.

Furthermore, among the solar cells horizontally and/or vertically provided at the oblique angle with various heights, widths, and intervals, the oblique angles, heights, and widths of adjacent solar cells may be variously set according to the types of cultivation crops.

According to other embodiments, smart-farm solar cells include: a dichroic optical filter transmitting selected wavelengths of sunlight coming from the sun and reflecting other wavelengths of the sunlight; and a plurality of solar cells provided at a light entrance side of the dichroic optical filter at a set angle with respect to a direction in which sunlight is incident, the solar cells having an angle (90—the set angle) with respect to the dichroic optical filter, a set height, a set width, and a set interval therebetween and being arranged in horizontal and/or vertical directions. Therefore, the solar cells may adjust solar power generation and sunlight transmission and may generate electricity by using sunlight coming from the sun and wavelengths of sunlight reflected from the dichroic optical filter.

In addition, the selected wavelengths, which the dichroic optical filter transmits, may include a blue wavelength ranging from 400 nm to 500 nm and a red wavelength ranging from 640 nm to 700 nm which are necessary for plant cultivation.

In addition, when a sun plant is cultivated, transmission of sunlight to the dichroic optical filter may be increased by decreasing the set height of the solar cells, increasing the set interval between the solar cells, and/or adjusting the set angle of the solar cells such that the solar cells are almost parallel to sunlight.

In addition, when a shade plant is cultivated, transmission of sunlight to the dichroic optical filter may be decreased by increasing the set height of the solar cells, decreasing the set interval between the solar cells, and/or adjusting the set angle of the solar cells to be close to 90 degrees with respect to the direction in which sunlight is incident.

In the present invention, various types of transparent, semi-transparent, and opaque solar cells may be used. Particularly, inorganic thin-film solar cells may be used in the embodiments shown in FIGS. 1, 4 to 8, and 12.

As described above, according to the smart-farm solar cells of the present invention, electricity necessary for plant cultivation can be produced by solar power generation while supplying sunlight to a cultivation facility, a greenhouse, or a smart farm while reflecting sunlight unnecessary for plant cultivation by the dichroic optical filter so as to create a pleasant cultivation environment in the smart farm and convert the sunlight unnecessary for plant cultivation into electricity, thereby maximizing the use efficiency of sunlight.

REFERENCE NUMERALS

100: Solar cells for a smart farm
110: Cover
120: Transparent encapsulation film
130: Dichroic optical filter
200: Plate-type solar cells
250: Inorganic thin-film solar cells (solar cells)
260: Module case
300: Transparent flexible substrate
400: Transparent solar cell module

What is claimed is:
1. A solar cell module for a cultivation facility, the solar cell module comprising:
   a module case;
   dichroic optical filters; and
   solar cells connected in a lattice form and inserted into vertical or inclined grooves provided in the module case,
   wherein the dichroic optical filters are attached to an underside of the solar cells connected in the lattice form,
   wherein the dichroic optical filters are configured to transmit selected wavelengths of sunlight ranging from 400 nm to 500 nm and 640 nm to 700 nm and reflect other wavelengths of sunlight, wherein the solar cells are configured to generate electricity using sunlight reflected from the dichroic optical filters, and wherein the solar cells connected in the lattice form are configured to be adjusted in height, width, and spacing therebetween by adjusting an installation angle of the solar cells using the vertical or inclined grooves provided in the module case.

\* \* \* \* \*